(12) United States Patent
Horie et al.

(10) Patent No.: US 7,468,574 B2
(45) Date of Patent: Dec. 23, 2008

(54) PIEZOELECTRIC RESONATOR FOR OSCILLATOR AND SURFACE MOUNT TYPE PIEZOELECTRIC OSCILLATOR

(75) Inventors: Kyo Horie, Chigasaki (JP); Makoto Komai, Chigasaki (JP)

(73) Assignee: Epson Toyocom Corporation, Kawasaki (JP)

( * ) Notice: Subject to any disclaimer, the term of this patent is extended or adjusted under 35 U.S.C. 154(b) by 0 days.

(21) Appl. No.: 11/471,711

(22) Filed: Jun. 21, 2006

(65) Prior Publication Data

US 2006/0267451 A1  Nov. 30, 2006

(51) Int. Cl.
*H01L 41/053* (2006.01)

(52) U.S. Cl. ...................... 310/344; 310/348

(58) Field of Classification Search .......... 310/340, 310/344, 348
See application file for complete search history.

(56) References Cited

U.S. PATENT DOCUMENTS

| | | | | |
|---|---|---|---|---|
| 5,438,305 A | * | 8/1995 | Hikita et al. | 333/32 |
| 5,459,368 A | * | 10/1995 | Onishi et al. | 310/313 R |
| 6,229,249 B1 | * | 5/2001 | Hatanaka et al. | 310/348 |
| 6,456,168 B1 | * | 9/2002 | Luff | 331/68 |
| 6,674,221 B2 | * | 1/2004 | Funahara et al. | 310/348 |
| 6,734,605 B2 | * | 5/2004 | Kinoshita | 310/348 |
| 7,256,659 B2 | * | 8/2007 | Mizumura et al. | 331/68 |
| 7,259,501 B2 | * | 8/2007 | Usuda | 310/344 |
| 2007/0126316 A1 | * | 6/2007 | Usuda et al. | 310/348 |
| 2007/0138916 A1 | * | 6/2007 | Koyama | 310/348 |
| 2007/0176517 A1 | * | 8/2007 | Moriya et al. | 310/348 |
| 2007/0228892 A1 | * | 10/2007 | Koyama et al. | 310/348 |
| 2007/0247030 A1 | * | 10/2007 | Naruse | 310/348 |
| 2007/0252482 A1 | * | 11/2007 | Sakai | 310/348 |

FOREIGN PATENT DOCUMENTS

| | | |
|---|---|---|
| JP | A 11-355047 | 12/1999 |
| JP | A 2000-027804 | 1/2000 |
| JP | A 2001-177346 | 6/2001 |
| JP | A-2004-007469 | 1/2004 |
| JP | A 2004-235719 | 8/2004 |
| JP | A 2005-175848 | 6/2005 |

* cited by examiner

*Primary Examiner*—Thomas M Dougherty
(74) *Attorney, Agent, or Firm*—Oliff & Berridge, PLC

(57) ABSTRACT

A piezoelectric resonator for an oscillator contained in an upper concave portion of an insulating case that has a metal lid with which the upper concave portion is air-tightly closed comprises a GND electrode being conductively coupled to an earth pattern of the piezoelectric resonator and provided on an outer bottom face of the insulating case, a piezoelectric connecting electrode being conductively coupled to an excite electrode of the piezoelectric resonator and provided on the outer bottom face of the insulating case, and an adjustment electrode being conductively coupled to the metal lid and provided on the outer bottom face of the insulating case in such a way that a regulator circuit in an IC part conductively contacts with the adjustment electrode if the IC part including the oscillation circuit is attached to the outer bottom face of the insulating case, wherein the metal lid serves as an adjustment terminal.

3 Claims, 4 Drawing Sheets

PIEZOELECTRIC RESONATOR FOR OSCILLATOR AND SURFACE MOUNT TYPE PIEZOELECTRIC OSCILLATOR

BACKGROUND OF THE INVENTION

1. Technical Field

The present invention relates to a piezoelectric resonator for an oscillator and a surface mount type piezoelectric oscillator with which an inconvenience of adjustment work by using a small adjustment terminal provided on a side of a package is eliminated.

2. Related Art

In a mobile communication market, many manufactures of mobile terminal devices promote modularization of parts and components by their functions in consideration of assembly designs, maintenance and handleability of the electric components and compatibility of the components among devices. At the same time, there are strong requests for downsizing of the devices and low manufacturing costs with the advance of the modularization.

There is a trend of the modularization especially in circuit parts whose functions and hardware configurations are established and for which high stability and enhanced performance are further requested. As such circuit parts, a reference oscillation circuit, a phase-locked loop (PLL) circuit, a synthesizer circuit and the like can be named. When these parts are modularized as a package, there is an advantage that a shielding structure can be more easily secured.

As the electric parts which are modularized and packaged with associated parts for surface mounting, for example, there are a piezoelectric resonator, a piezoelectric oscillator, a surface acoustic wave (SAW) device and the like. For example, a module having a two-story structure as shown in FIG. 6 can be adopted in order to maintain performances of the electric parts and to further minimize the size of the module.

JP-A-2001-177346 and JP-A-11-355047 are a first example of related art. FIG. 6A is a longitudinal sectional view showing a structure of the two-story type module of a surface mount type piezoelectric device (a crystal oscillator) as the first example. A crystal resonator 100 and an under part member 107 (an IC parts unit) are shown in FIG. 6A. The crystal resonator 100 has a crystal resonant element 103 in a container consisting of a ceramic case body 101 and a metal lid 102. The under part member 107 has an IC part 106 that includes an oscillation circuit, a temperature compensating circuit and the like. The IC part 106 is assembled in a form of a bare-chip, placed in an empty space 105a in a case 105 that is attached to the bottom face of the crystal resonator 100, and sealed. As described in the first example, when such crystal oscillator is mounted on a printed wiring board, an external electrode 105b provided on the bottom face of the case 105 is soldered.

JP-A-2000-278047 is a second example of related art. FIG. 6B is a sectional view showing a structure of a two-story type module of the crystal oscillator as the second example. As shown in FIG. 6B, the empty space 105a in the under part member 107 is opened downward and the opening of the empty space 105a is closed with a bottom plate 105c if required. These are the different features from those of the above-described first example with reference to FIG. 6A.

In the above described first and second examples, an adjustment terminal 110 for adjusting a regulator circuit included in the IC part is provided on the outer surface of the case body 101. The adjustment terminal 110 is used, for example, for rewriting a value of an element (temperature compensation parameter) consisting the temperature compensating circuit in the IC part. This rewriting is conducted by making an unshown probe contact with the adjustment terminal 110 and then putting data through the probe. When a manufacturer of the oscillator supplies the crystal resonator 100 that is assembled with the case 105 containing the IC part 106 to an assembly company (for example, a cellular phone manufacturer), the oscillator manufacturer adjusts the element value by using the adjustment terminal then ships the oscillator to the assembly company. Therefore, the assembly company can use the piezoelectric oscillator without any adjustment work.

However, the size of the adjustment terminal 110 has to be small since it is provided on the side face of the small oscillator whose size is about some ten millimeter in length and width. Accordingly, the adjustment work with a probe becomes extremely delicate and an inefficient work. Moreover, the size of the adjustment terminal 110 cannot be made further smaller because a sufficient area with which the probe contacts has to be secured. This also puts a limit on the size of the oscillator, and this becomes a problem when there is a request for a smaller size oscillator. Solution to such problem is now strongly needed.

Meanwhile, assembly companies lately purchase less completed oscillators in which the crystal oscillator is assembled with the IC part in order to reduce costs. Instead, the assembly companies buy only the crystal resonator part of the oscillator and assemble it with the IC part by themselves. In this case, if the adjustment work is conducted by making the probe contact with the adjustment terminal provided on the side of a device such as a cellular phone after the completed oscillator is embedded in the device, it could be difficult to perform the adjustment work in such a way that other parts around the terminal provided on the side of the product hamper the work. In this way, the adjustment work could become difficult depending on layouts. Therefore, an enough space between the oscillator and the adjacent other parts should be secured for the probe to be interposed therebetween in order to perform the adjustment work. This space becomes a problem when the device is needed to be downsized.

SUMMARY

An advantage of the present invention is to provide a surface mount type piezoelectric oscillator integrated with an IC part including an oscillation circuit and the like. The IC part is provided outside the package of the piezoelectric resonator. In the piezoelectric oscillator, a metal lid that used to be grounded is utilized as the adjustment terminal. Accordingly, the adjustment work becomes efficient, the problem of the downsizing of the oscillator is solved, and the adjustment work performed by the assembly company can also become easier. The advantage of the present invention is also to provide a piezoelectric resonator for an oscillator thereof.

According to a first aspect of the invention, a piezoelectric resonator for an oscillator contained in an upper concave portion of an insulating case that has a metal lid with which the upper concave portion is air-tightly closed, includes a GND electrode being conductively coupled to an earth pattern of the piezoelectric resonator and provided on an outer bottom face of the insulating case, a piezoelectric connecting electrode being conductively coupled to an excite electrode of the piezoelectric resonator and provided on the outer bottom face of the insulating case, and an adjustment electrode being conductively coupled to the metal lid and provided on the outer bottom face of the insulating case in such a way that a regulator circuit in an IC part conductively contacts with the adjustment electrode if the IC part including the oscillation circuit is attached to the outer bottom face of the insulating case, wherein the metal lid serves as an adjustment terminal.

In this case, a whole upper face of the metal lid may be used as the adjustment terminal if the adjustment electrode is single.

Moreover, an upper face of the metal lid may be comparted into a number of areas if the adjustment electrode is provided in the plural number, the number of the comparted areas of the metal lid is same as the number of the adjustment electrode, and each comparted area serves as an independent adjustment terminal.

According to a second aspect of the invention, a surface mount type piezoelectric oscillator includes the above-mentioned piezoelectric resonator.

According to the first aspect of the invention, in the surface mount type piezoelectric oscillator integrated with the IC part (IC part unit) including the oscillation circuit and the like provided on the bottom of the package of the piezoelectric resonator, it is possible to utilize the metal lid that used to be grounded for shielding as the adjustment terminal. Accordingly, the adjustment work can be performed more efficiently and the problem that hampers the downsizing of the oscillator is solved. Furthermore, the adjustment work performed by the assembly company can also become easier in the case where the assembly company buys only the piezoelectric resonator and assembles it into the oscillator.

Moreover, if the adjustment terminal is single, the whole surface of the metal lid can be used as the adjustment terminal so that the adjustment work can be more easily performed.

Furthermore, if the adjustment electrode is provided in the plural number (for example, four adjustment electrodes provided), the lid member made of the insulating material can be divided into a number of the conductive areas (four comparted areas) and each area can be used as the adjustment terminal.

According to the second aspect of the invention, it is possible to provide the piezoelectric oscillator having the above-mentioned advantages.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the accompanying drawings.

Figure 1:
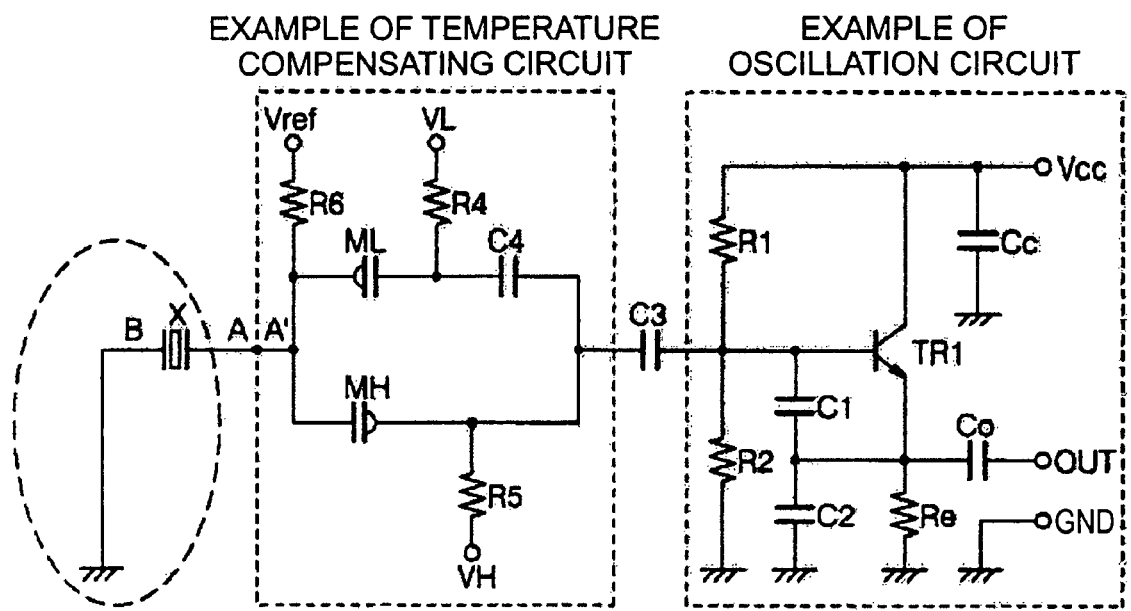
FIG. 1 is a sectional view showing a structure of a piezoelectric resonator according to an embodiment of the invention.

FIG. 1 is a circuit diagram of a crystal oscillator according to an embodiment of the invention. FIG. 4 shows a sectional view of the crystal oscillator which is assembled with a part including a circuit of the crystal oscillator.

In the crystal oscillator shown in FIG. 1, for example, an input terminal of a Colpitts oscillator circuit is coupled to an end of a temperature compensating circuit through a capacitor. Other end of the temperature compensating circuit is coupled to a terminal A of a crystal resonator. The other terminal B of the crystal resonator is grounded as designated GND in the figure.

The Colpitts oscillator circuit and the temperature compensating circuit shown in FIG. 1 are integrated as an IC chip. When settings of the circuits are needed to be changed, a control signal is externally supplied to the IC chip and data in a memory (not shown in the figure) in the IC chip is rewritten by the control signal.

For this reason, at least, an adjustment terminal which is an input terminal of the control signal, a connecting terminal A' that is coupled to the terminal A of the crystal resonator, a GND terminal and an output terminal of the oscillator circuit are provided in the IC part including the oscillator circuit and the temperature compensating circuit.

Figure 4A:
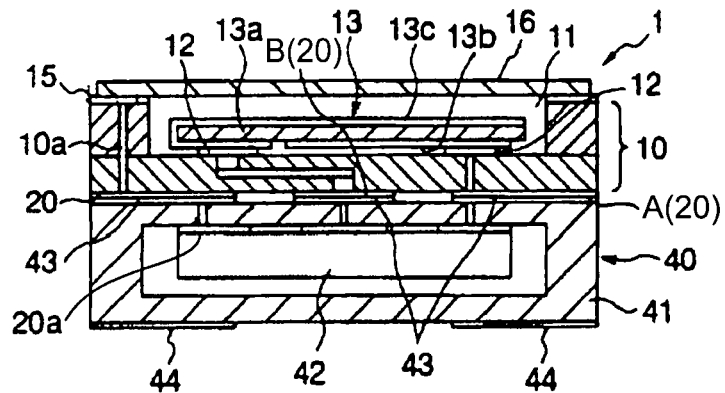
FIG. 4A and FIG. 4B are explanatory drawings for a structure of the crystal oscillator according to an embodiment of the invention.
Figure 4B:
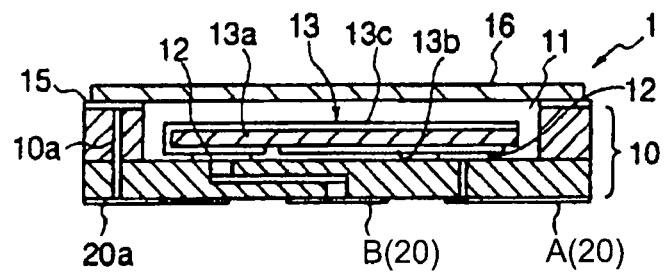

On the other hand, a crystal oscillator shown in FIG. 4A has a configuration that the above-described IC part is provided on the back side of the crystal resonator whose structure is shown FIG. 4B.

More specifically, a crystal resonator 13 (a piezoelectric resonator) is electrically and mechanically coupled onto an inner electrode 12 through a conductive adhesive. The inner electrode 12 is provided in an upper concave area 11 of a case body 10 made of an insulating material such as ceramic. A metal lid 16 (a lid member) is electrically and mechanically coupled by welding and the like to a conductive ring 15 provided in an upper area of the outer face of the case body 10, and this air-tightly seals the concave area 11.

Furthermore, a bottom electrode 20 is provided in the plural number on the outer bottom face of the case body 10.

A conductive pattern 13c which is an excite electrode as well as a lead electrode extended from the excite electrode is provided on the under face of the crystal resonator 13 (inner bottom face of the case body). A conductive pattern 13b is conductively coupled to a bottom electrode 20. The conductive pattern 13c is conductively coupled to other bottom electrode 20 (a bottom electrode other than the one coupled to the conductive pattern 13b). The bottom electrode 20 coupled to the conductive pattern 13b serves as the above-mentioned connecting terminal A and the bottom electrode 20 coupled to the conductive pattern 13c serves as the connecting terminal B.

The metal lid 16 is conductively coupled to at least one other bottom electrode ((adjustment electrode 20a): The bottom electrode other than the ones coupled to a conductive pattern 13c and the conductive pattern 13b) through a wiring pattern provided on the surface or the inner face of the case body 10.

In the crystal oscillator shown in FIG. 4A, the connecting terminal A' of the temperature compensating circuit in an IC part 42 is conductively coupled to the connecting terminal A of a crystal resonator 1. A GND electrode of the IC part 42 is conductively coupled to the connecting electrode B of the crystal resonator 1. An adjustment terminal of the IC part 42 is conductively coupled to a bottom electrode 20 (adjustment electrode 20a) that is electrically coupled to the metal lid 16. An output electrode, the GND electrode and a power supply electrode (a crystal oscillator function electrode) of the IC part 42 are conductively coupled to mounting terminals 44 of the oscillator through conductive paths provided on the surface or the inside of a case 41.

Though the crystal oscillator shown in FIG. 4A has the mounting terminal side of the case 41 which is closed, the upper face of the IC part 42 (the lower face of the case 42) may be opened.

Moreover, though the crystal resonator 1 is coupled to the IC part 42 through the case 41 in the above-described embodiment, the IC part 42 may be directly coupled to the bottom face of the case body 10 of the crystal resonator 1 in such a way that the IC part 42 faces down on the bottom face. In this case, the shape of the case 41 becomes a concave and frame figure. For example, if a metal bowl is mounted on the back side of the case body 10 instead of the case 41, the crystal oscillator function electrode of the IC part 42 may be conductively coupled to the bowl through an internal wiring of the case body 10.

Though the coupling face of the IC part 42 opposes the case body 10 of the crystal resonator 1 in the above-described embodiment, the IC part 42 may face down on the bottom face in the cavity of the case 41 and may be conductively coupled to the crystal resonator 1 through a conductive path provided on the case 41.

The crystal resonator 1 may have a plurality of excite electrodes on one main face of the resonator and may have a common electrode facing the plurality of the excite electrodes on the other main face. In this case, the crystal resonator 1 will be mounted on the case body 10 in such a way that the common electrode opposes the metal lid 16 side, and the common electrode is grounded. A two terminal circuit having at least two excite terminals is coupled in series in an oscillation loop.

Though the terminal of the crystal resonator 1 is coupled to GND in the above-described embodiment, for example, a capacitor element whose capacitance value is more than 100 pF may be interposed between the upper face electrode of the crystal resonator and GND if shielding effectiveness by alternative electric current is sufficient.

With the above-described configuration of the crystal oscillator, an grounded excite electrode 13c provided on the crystal resonator 13 can serve as a shielding conductive material and the metal lid 16 can be used as the adjustment terminal. Accordingly, it is possible to reduce the number of the adjustment terminals that should be provided on the case body 10 or on the case 41 because the metal lid 16 serves as the adjustment terminal.

In the above-described embodiment, the crystal oscillator required a shield function. However, when the crystal oscillator is embedded in a shield in a device so that the separate shield function is not necessary for the crystal oscillator, for example, the crystal oscillator shown in FIG. 4B may have the temperature compensating circuit or other electric circuits between the terminal B of the crystal resonator and GND as shown in FIG. 1 as long as the metal lid 16 of the crystal resonator 1 is conductively coupled to the adjustment terminal. Moreover, an inverter oscillation circuit shown in FIG. 2 like that may also be coupled between the terminal B of the crystal resonator and GND.

Figure 2A:
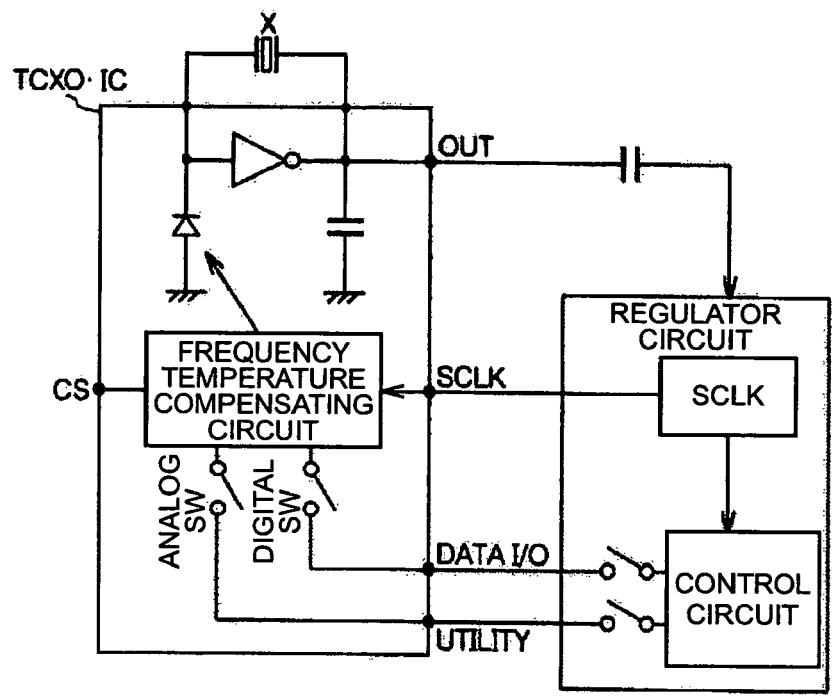
FIG. 2A is a circuit diagram of a hitherto known circuit configuration and FIG. 2B is a circuit diagram of a typical circuit configuration according an embodiment of the invention.

FIG. 2A is a circuit diagram of a hitherto known temperature compensating circuit and a hitherto known regulator circuit. As the adjustment terminal, four terminals such as chip select (CS), data in/out (DIO), analog voltage in/out (UTIL) and clock input (SCLK) were used in order to adjust the regulator circuit in an IC part (TCXO IC). The terminal CS is a signal terminal for selecting the desired TCXO IC from an adjustment device side. The DIO terminal is a signal terminal for communication handshake. The UTIL terminal is a signal terminal for an analog voltage from a sensor detecting a temperature change. The SCLK terminal is a terminal for an externally supplied clock signal that drives the TCXO IC. The hitherto known IC part required such four terminals as described. Furthermore, the clock signal was supplied from the outside so that it was not possible to synchronize the oscillation output of the TCXO IC with the adjustment device.

Figure 2B:
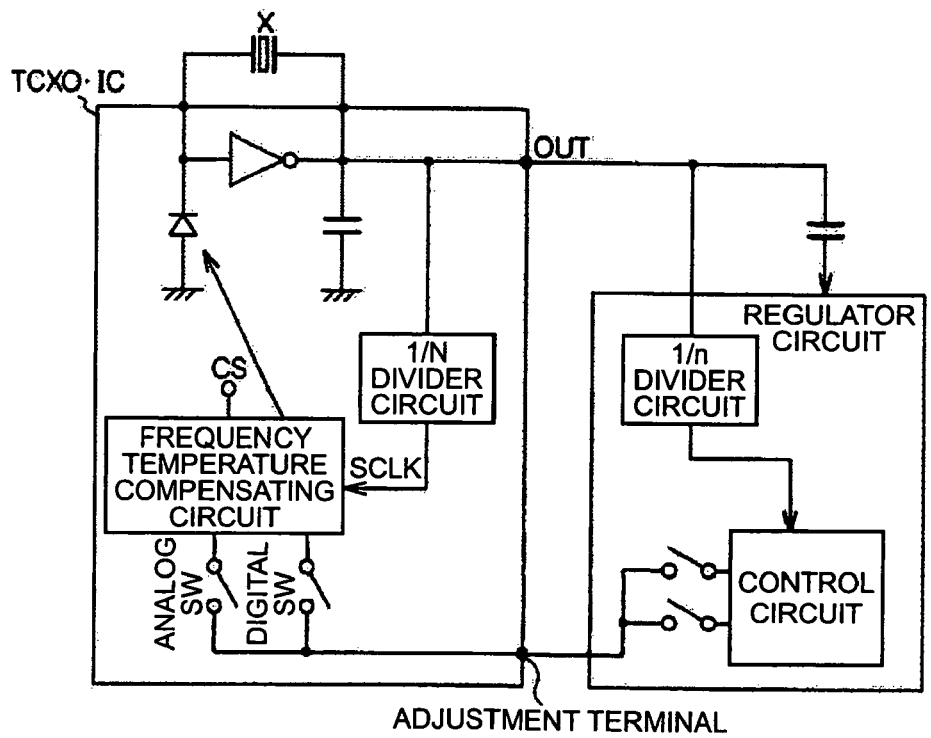

FIG. 2B is an explanatory drawing for a circuit according to the invention. In the circuit shown in FIG. 2B, the SCLK is generated by dividing the output of the crystal oscillator circuit and it is supplied to the TCXO IC (elimination of the SCLK terminal). The DIO and the UTIL terminals are coupled to a common terminal (reduce the signal lines from two to one signal line). The CS terminal is also eliminated by selecting the TCXO IC each time required. In this way, the number of the terminal can be reduced from four to one and it is also possible to synchronize the TCXO IC with the adjustment device.

The crystal resonator 1 of the embodiment according to the invention combines an adjustment electrode 20a according to the terminal configuration of the IC part, and the adjustment electrode 20a is conductively coupled to the metal lid 16. In this way, the metal lid can be used as the adjustment terminal.

In other words, the characteristic configuration of the embodiment is that the adjustment electrode 20a is conductively coupled to the metal lid 16 through the internal conductive material 10a inside the case body so that the whole upper face of the metal lid 16 can be use as the adjustment terminal. According to such configuration, it is possible for the adjustment probe to contact with the metal lid 16 whose area is much larger than that of the hitherto known adjustment terminal provided on the side face of the case body. Therefore, the adjustment work can be carried out more easily and efficiently. Moreover, since the adjustment terminal is not separately provided on the side face of the case body, the oscillator can be mounted close to a peripheral part on a printed wiring board when the oscillator including the crystal resonator is mounted on the printed wiring board in the device body. It was common that the earth pattern 13c on the crystal resonator 13 is grounded and the metal lid is also grounded in order to exert the shield effect. However, the metal lid is not necessarily grounded to obtain the shield effect. For this reason, the embodiment adopts the idea of utilizing the metal lid as the adjustment terminal.

Figure 3:
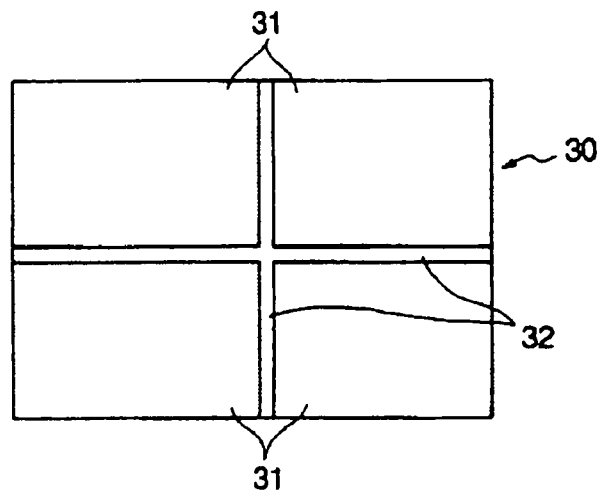
FIG. 3 shows a structure of a lid part of a crystal oscillator according to a modification embodiment of the invention.

When the crystal resonator having the four adjustment electrodes corresponding to the four adjustment terminals of the hitherto known IC part is adopted, a lid 30 (lid member) made of insulating material such as ceramic is used as shown in FIG. 3 instead of the metal lid. A comparted area 31 (a regulator area) provided in a plural number on the lid so as to corresponds to the number of the adjustment electrode is formed on the insulating base substrate by metallization. Each comparted area 31 is coupled to the corresponding adjustment electrode and is used as the independent adjustment terminal. The partition area 31 is defined by an exposed area 32 of the insulating base substrate. An extended electrode is preferably provided from each partition area 31 and throughout the side and the bottom face of the insulating base substrate in order to secure the electrical continuity of each partition area 31 and the corresponding adjustment electrode.

FIG. 4 is a sectional view of the crystal oscillator including the crystal resonator according to an embodiment of the invention. As shown in the figure, an IC part unit 40 containing the IC part is fixed on the bottom of the crystal resonator 1. The IC part unit 40 includes a case 41 that is made of an insulating material such as ceramic and contains the IC part 42. An upper electrode 43 is conductively coupled to the electrode of the IC part one by one is formed on the upper face of the case 41. On the bottom of the case 41, the mounting terminal 44 is provided.

Figure 5:
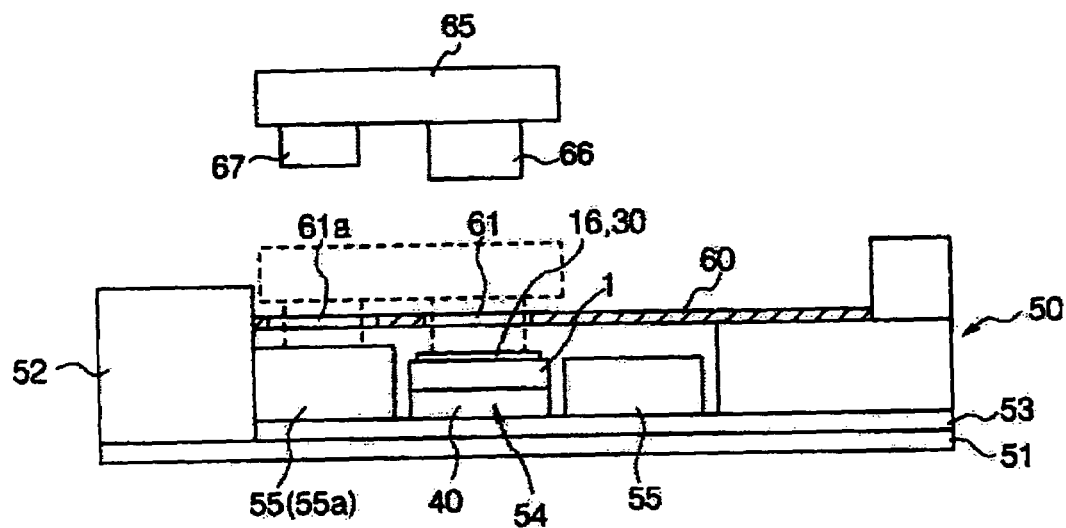
FIG. 5 is an explanatory drawing for an adjustment work performed to the oscillator of the embodiment which is embedded in a device body.
Figure 6A:
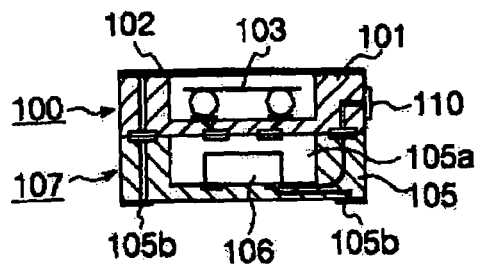
FIG. 6A and FIG. 6B are explanatory drawings for hitherto known piezoelectric devices.
Figure 6B:
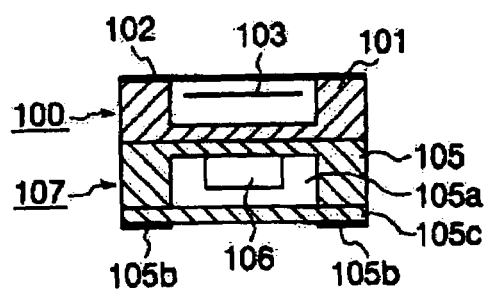

FIG. 5 is an explanatory drawing for an adjustment work which is performed when the assembly company (for example, a cellular phone manufacturer) bought only the crystal resonator in which various value adjustments such as the temperature compensation parameter adjustment have not been done yet and the company assembles the crystal resonator with the IC part including the oscillation circuit, the temperature compensating circuit and the like.

Reference numeral 50 designates a cellular phone which is an example of the device on which the crystal resonator is mounted. A battery pack 52, a printed wiring board 53 and the like are provided on a case 51. A surface mount crystal oscillator 54 and other parts 55 are provided on the printed wiring board 53. An opening 61 for adjustment which exposes the upper face of the surface mount crystal oscillator 54 is formed in a partition plate 60 which is provided above the printed wiring board 53.

The crystal oscillator 54 has the IC part unit 40 which is assembled with the crystal resonator 1 of the embodiment according to the invention. A two-dimensional bar code that stores the information of the temperature characteristic and the like of the crystal resonator is provided on the upper face of the lid members 16, 30 of the crystal resonator 1. The two-dimensional bar code and the upper face of the lid members 16, 30 are exposed through the adjustment opening 61 provided in the partition plate 60. Therefore, a barcode reader and a adjustment pin 66 (probe) provided in an adjustment device 65 are inserted through the adjustment opening 61 in order to read the information recorded in the barcode and to simultaneously input the adjustment data based on the read data. If other adjustment part (such as the part 55a) that needs to be adjusted than the crystal oscillator 54 is provided, the part 55a is exposed through other opening 61a and a different adjustment pin 67 provided in the adjustment device 65 is used to input the adjustment data to the part 55a.

Though the crystal oscillator is shown as the typical example of the piezoelectric oscillator in the above-described embodiments, the invention can also be applied to other oscillator using a piezoelectric resonator made of a piezoelectric material.

What is claimed is:

1. A piezoelectric oscillator comprising:
    a piezoelectric resonator having a structure in which a piezoelectric vibrating element is sealed by a container and a lid; and
    an IC part provided with an oscillation circuit;
    wherein the container has, on an outer bottom part thereof, a GND electrode conductively coupled to an electrode of the piezoelectric vibrating element,
    the IC part has an input terminal to which a signal for rewriting data in a memory of the IC part is inputted,
    the lid has a metal surface,
    the input terminal and the metal surface of the lid are conductively coupled, and
    the electrode of the piezoelectric vibrating element opposes the lid and serves as a shielding conductive material.

2. The piezoelectric oscillator according to claim 1, wherein the IC part has one input terminal.

3. The piezoelectric oscillator according to claim 1, wherein the IC part has a plurality of input terminals and the metal surface of the lid is divided into a plurality of sections.

* * * * *